United States Patent [19]
Ohara et al.

[11] Patent Number: 5,482,784
[45] Date of Patent: Jan. 9, 1996

[54] PRINTED CIRCUIT INNER-LAYER COPPER FOIL AND PROCESS FOR PRODUCING THE SAME

[75] Inventors: Muneharu Ohara, Hasuda; Masakazu Mitsuhashi, Kitaadachi, both of Japan

[73] Assignee: Mitsui Mining and Smelting Co., Ltd., Tokyo, Japan

[21] Appl. No.: 359,871

[22] Filed: Dec. 20, 1994

[30] Foreign Application Priority Data

Dec. 24, 1993 [JP] Japan ..................... 5-345893

[51] Int. Cl.⁶ .............. C25D 7/06; B32B 15/20
[52] U.S. Cl. ............ 428/607; 428/626; 428/658; 428/675; 428/687; 428/935; 205/111
[58] Field of Search .................. 428/606, 607, 428/601, 626, 687, 675, 935, 658; 205/111; 174/256, 259

[56] References Cited

U.S. PATENT DOCUMENTS 4,323,632  4/1982  Berdan et al. ............... 428/626
4,661,417  4/1987  Suzuki et al. ............... 428/612
5,019,944  5/1991  Ishii et al. .................. 361/406
5,262,247  11/1993  Kajiwara et al. ............ 428/607
5,366,814  11/1994  Yamanishi et al. .......... 205/111
5,413,838  5/1995  Azuma et al. ............... 428/626

FOREIGN PATENT DOCUMENTS 1-170501  7/1989  Japan ..................... 428/687
1-275036  11/1989  Japan ..................... 428/612

Primary Examiner—John Zimmerman
Attorney, Agent, or Firm—Bucknam and Archer

[57]  ABSTRACT

A printed circuit inner-layer copper foil having inverted tear drop-shaped fine nodules formed on both surfaces of a copper foil each having surface roughness $Rz=1$ to 3 μm, the nodules having a length of 0.6 to 1.0 μm and a maximum diameter of 0.2 to 0.8 μm, and a process for producing said inner-layer copper foil.

3 Claims, 1 Drawing Sheet

PRINTED CIRCUIT INNER-LAYER COPPER FOIL AND PROCESS FOR PRODUCING THE SAME

BACKGROUND OF THE INVENTION

1. Field of the Invention

The present invention relates to a copper foil for an inner layer board of a very thin, fine pitched pattern multi-layer board and a process for producing the same. More particularly, it relates to a printed circuit inner-layer copper foil having low surface roughness with fine nodules formed on both surfaces of the foil thereby to make it possible to obtain fine pitched pattern circuits by etching and have high adhesion to a substrate and also to a process for producing the same.

2. Prior Art

Conventional multi-layer boards have been produced by bonding ordinary inner-layer copper foils (where mat (rough) surface roughness Rz is around 7.0 µm and shiny (smooth) surface roughness is around 0.7 µm) having nodules formed on their mat surface to substrates facing to the mat surface, preparing circuits by etching, subjecting the circuits to black oxide treatment, adhering substrates respectively to the outsides of the circuits under heat and pressure, adhering copper foils respectively to the outsides of these substrates under heat and pressure, and then etching the outer copper foils to form circuits thereby to prepare a four-layer printed circuit board. To prepare five- or more-layer printed circuit (multilayer) printed circuit boards, the above steps may be repeated in turn. Alternatively, a copper foil with nodules formed on both side thereof (where mat surface roughness Rz is around 8.5 µm and shiny surface roughness Rz is around 1.6 µm) is commercially available as a both surfaces-treated copper foil.

However, in the above-mentioned black oxide treatment, a haloing phenomenon tends to take place since the oxide film is solved in a hydrochloric acid solution. Thus, the insulating characteristics and the reliability of layer-to-layer interconnection will tend to be deteriorated. To overcome such defects, the black oxide treatment may be followed by a chemical reduction treatment. The black oxide treatment should be performed using a concentrated alkaline solution and, in addition, the reduction treatment should be performed whereby the production cost will increase.

On the other hand, since the conventional both surfaces-treated copper foil has copper nodules formed on both the surfaces thereof, the above-mentioned problem is not raised. However, since this treated copper foil is prepared from a conventional copper foil, its mat surface roughness is high. Thus, this treated copper foil is difficult for use in the preparation of fine pitched pattern circuits therein which are now in rapid progress. When the surface roughness of the copper foil at the interface with the substrate is high, the linearity of the foot-line of conductor will decrease after circuits are obtained by etching. Thus, if the conductor spacing is small in this case, a problem such as migration will be occured.

In addition, multi-layer construction and thin board construction have now been in progress. To reduce the thickness of each layer consisting of a copper foil and a substrate therefor, tile thickness of the substrate is also decreased. Further, the decrease of interlayer insulation due to the roughness of the mat surface of the copper foil is strongly sought to be prevented as far as possible.

Since the shiny surface roughness Rz of a conventional copper foil is as low as 0.5 to 1 µm, the strength of adhesion of the copper foil to the substrate will be unable to be improved even if the nodule forming treatment is performed on said surface. When the size of the nodules is increased in an attempt to enhance the adhesion strength, the nodules themselves on the copper foil will raise a problem such as dropping off from the copper foil. In addition, there are apt to be raised secondary problems that the nodules will be left in a substrate after a circuit is prepared by etching or they will be crushed when pressed.

SUMMARY OF THE INVENTION

A first object of the present invention is to provide a printed circuit inner-layer copper foil which can serve to solve problems of the conventional technologies, improve the interlayer reliability, reduce the number of treatment steps, improve the etching characteristics for preparation of fine pitched pattern circuits, prevent the lowering of inter-layer insulation due to reduction in thickness of substrates used, and improve adhesion of shiny surface of the copper foil.

A second object of the present invention is a process for producing said copper foil.

The first object of the present invention is achieved by provision of the following copper foil.

The present invention resides in a printed circuit inner-layer copper foil having inverted tear drop-shaped fine nodules formed on both surfaces of mat surface roughness Rz=1 to 3 µm and shiny surface roughness Rz=1 to 3 µm of the copper foil, the nodules having a length of 0.6 to 1.0 µm and a maximum diameter of 0.2 to 0.8 µm.

DETAILED EXPLANATION OF THE EMBODIMENT

Next, the present invention will be explained in detail.

The copper foil used in the present invention is preferably (1) an electrolytic copper foil with remarkably low mat surface roughness, formed by special electrolysis, (2) a copper foil prepared from a conventional electrolytic copper foil by lowering electrolytically precipitated copper protuberances on the mat surface of the conventional copper foil by means of chemical polishing, that is, etching to reduce the roughness of said mat surface, while somewhat etching the shiny surface of the conventional foil to increase the roughness of the shiny surface, (3) a copper foil prepared from a conventional electrolytic copper foil by rolling the conventional foil so as to reduce the roughness thereof, or (4) a copper foil prepared from a rolled copper foil by roughening both the surfaces thereof by means of chemical polishing.

The surface roughness of the above-mentioned copper foils used in the present invention is equal to or less than 3 µm terms of in Rz value defined in JIS B 0601. This value is much smaller than Rz≧10 µm for a conventional copper foil and Rz≧5 µm for an LP foil each in the IEC standard.

An electrolytic copper foil having a mat (rough) surface and a shiny (smooth) surface will be explained hereunder.

When the mat surface roughness Rz of an electrolytic copper foil exceeds 3 µm, current will be concentrated on the convex portions of the copper foil surfaces in a later step of nodule formation by electrolysis, large-sized nodules are formed and concentrated on said convex portions. Thus, the roughness of the mat surface of the copper foil will finally increase and, consequently, interlayer insulation will be lowered when thin prepregs are used in the preparation of a multilayer board. When the mat surface roughness of a copper foil is less than 1 μm, the adhesion of the foil to a substrate is to be maintained only by the nodules. Thus, the adhesion of the copper foil to the substrate after laminated on each other will be remarkably lower than that of the conventional electrolytic copper foil, this raising a problem.

The shiny surface roughness of the above-mentioned copper foil with lower surface roughness is a transfer of the surface roughness of an drum cathode used in electroforming and, thus, it can be varied by adjusting the surface roughness of the conventional drum cathode. The shiny surface roughness Rz of a conventional copper foil in the range of 0.5 to 1.0 μm is disadvantageous when nodules are attached to the copper foil for enhancing the strength of adhesion thereof to a substrate in a later step of nodule formation by electrodeposition and, therefore, it is necessary to get a copper foil to have a certain shiny surface roughness Rz of about 1 to 3 μm. However, when the shiny surface roughness Rz exceeds 3 μm, a problem similar to that as to the mat surface will be raised since the total roughness of the mat and shiny surfaces of tile copper foil itself becomes high.

A conventional method may be applied for nodule formation on the mat surface of a copper foil, while nodules will not be formed on the shiny surface of the conventional copper foil without supplying greater current than that supplied to the mat surface since the shiny surface is originally smooth and has thereon very fewer nodules per unit area than those the mat surface has thereon. When such greater current is supplied to the shiny surface, nodules will be formed even thereon but they will be apt to be locally dendritic without formation of uniform and fine nodules, therefor the copper foil so treated will not be improved in its physical adhesion to a substrate with short of anchor effect of the nodules. Thus, it is necessary that a large number of fine and uniform nodules be formed on the smooth surface of the shiny surface other than the convex portions thereof. Conventionally, arsenic was added to obtain fine and uniform nodules that satisfy such requirements. However, for the reasons of pollution problem and health of workers, the arsenic has come to be unusable. To solve such a problem, a benzoquinoline type organic additive disclosed in Japanese Patent Gazette No. Sho 56-41196 may be used to perform electrolytic treatment under the following conditions for obtaining uniform and fine nodules.

Conditions:
Concentration of copper: 8 to 15 grams/liter
Concentration of sulfuric acid: 15 to 45 grams/liter
Additive: 10 to 200 milligrams/liter
Temperature: room temperature
Current density: 2 to 15 A/dm$^2$ The length of nodules electrolytically formed in the above manner is preferably in the range of 0.6 to 1.0 μm. When the nodules are less than 0.6 μm in length, their anchor effect is low since the nodules are formed on the flat surface of the copper foil, whereby the adhesion strength of the foil cannot be ensured. When the length of nodules is more than 1.0 μm, the resulting copper foil deteriorates in various characteristics since the roughness excessively increases. The maximum diameter of nodules is preferably in the range of 0.2 to 0.8 μm. When the maximum diameter of nodules is less than 0.2 μm, the strength of the nodules themselves is lowered whereby they are broken while the board is being processed and, as a result, the nodule-powdered and nodule-crushed phenomena will be presented. When the maximum diameter of nodules is more than 0.8 μm, the volume of the nodules becomes too large, thereby preventing a substrate resin from wrap around the nodules and resulting in lowering the adhesion strength.

The present invention enables a copper foil having a very satisfactory precise thickness because of its low surface roughness to be used as a very thin fine pitched pattern circuit inner-layer copper foil by electrolytically forming nodules on both the mat and shiny surfaces of said starting copper foil.

Since said nodules formed on both the surfaces are made of metal copper, a haloing phenomenon is not shown at all in the driling step and through-hole plating step. Said nodules are fine and uniform and consequently increase the roughness of a copper foil to a small extent as compared with the arsenic-containing nodules thereby to enhance the adhesion of the copper foil to the substrate. Moreover, since the nodules are densely formed, they have high resistance against under-etching of conductor when a circuit is formed by etching.

The copper foil with the nodules electrolytically formed thereon is subjected to rust-prevention treatment. For the rust-prevention of a copper foil according to the present invention, conventionally available rust-prevention methods can be used. The rust-prevention using zinc, a zinc-tin alloy or a zinc-nickel alloy is known to be very effective for preventing heat oxidization, improving adhesion of a foil toga substrate, and preventing under-etching of conductors in the steps of press-bonding of a copper foil to a resin substrate, forming a circuit by etching, plating and so forth when the copper foil is used as one for a circuit. Such rust-prevention is disclosed in Japanese Patent Gazettes Nos. Sho 58-56758 and Hei 4-47038.

Zinc, the zinc-tin alloy or the zinc-nickel alloy in the rust-prevention layer so obtained will be diffused so as to form a two-dimensional or three-dimensional alloy by heating the rust-prevention layer, whereby the above-mentioned effect can be further improved as disclosed in Japanese Patent Gazette No. Sho 58-53079.

The surface roughness of the copper foil prepared from a copper foil having low surface roughness by subjecting the latter foil to electrolytic nodule formation, rust-prevention treatment using zinc, the zinc-tin alloy or zinc-nickel alloy and heat diffusing treatment was measured and both the surfaces of the foil have Rz=2–4 μm each and they are each uniform and have nodules formed suitably uniformly as compared with a copper foil prepared from an ordinary electrolytic copper foil by treating both the surfaces of the ordinary copper foil so that said surfaces have mat surface roughness Rz=7 μm and shiny surface roughness Rz=1.5 μm respectively. Thus, the above present invention copper foil subjected to nodule formation, rust-prevention treatment and so on can be improved in good adhesion as a printed circuit inner-layer copper foil and enables a very fine pitched pattern circuit to be formed thereon since the amount of copper residual near the foot of conductors is small when the copper foil is etched for forming said circuit.

After the above-mentioned rust-prevention treatment, the above-mentioned copper foil may be subjected to chromate treatment or treatment with silane coupling agent before the heat diffusing treatment is performed. The chromate treatment may be performed under an acidic or alkaline condition and may be performed by an immersion method or electrolytic method. The silane coupling agent is for example γ-(methacryloxypropyl) trimethoxysilane, β-(3, 4-epoxycyclohexyl) ethyltrimethoxysilane, γ-glycidoxypropyl-trimethoxysilane, γ-glycidoxypropylmethyl-diethoxysilane, N-β-(aminoethyl), γ-aminopropyl-trimethoxysilane, N-β-(aminoethyl)γ-aminopropylmethyl-dimethoxysilane or γ-aminopropyl-triethoxysilane. The typical treatment conditions using a coupling agent are as follows.
Concentration of coupling agent: 1 to 10 grams/liter
pH: depending on the pH of the coupling agent
Temperature: room temperature
Treatment time: 5 to 10 seconds.

Normally, after the copper foils are treated with the coupling agent, they are not washed with water.

BRIEF DESCRIPTION OF A DRAWING

FIG. 1 is a microscopic photograph (×5000) showing the metallograph of a copper foil having nodules formed thereon.

DESCRIPTION OF THE PREFERRED EMBODIMENTS

Figure 1:
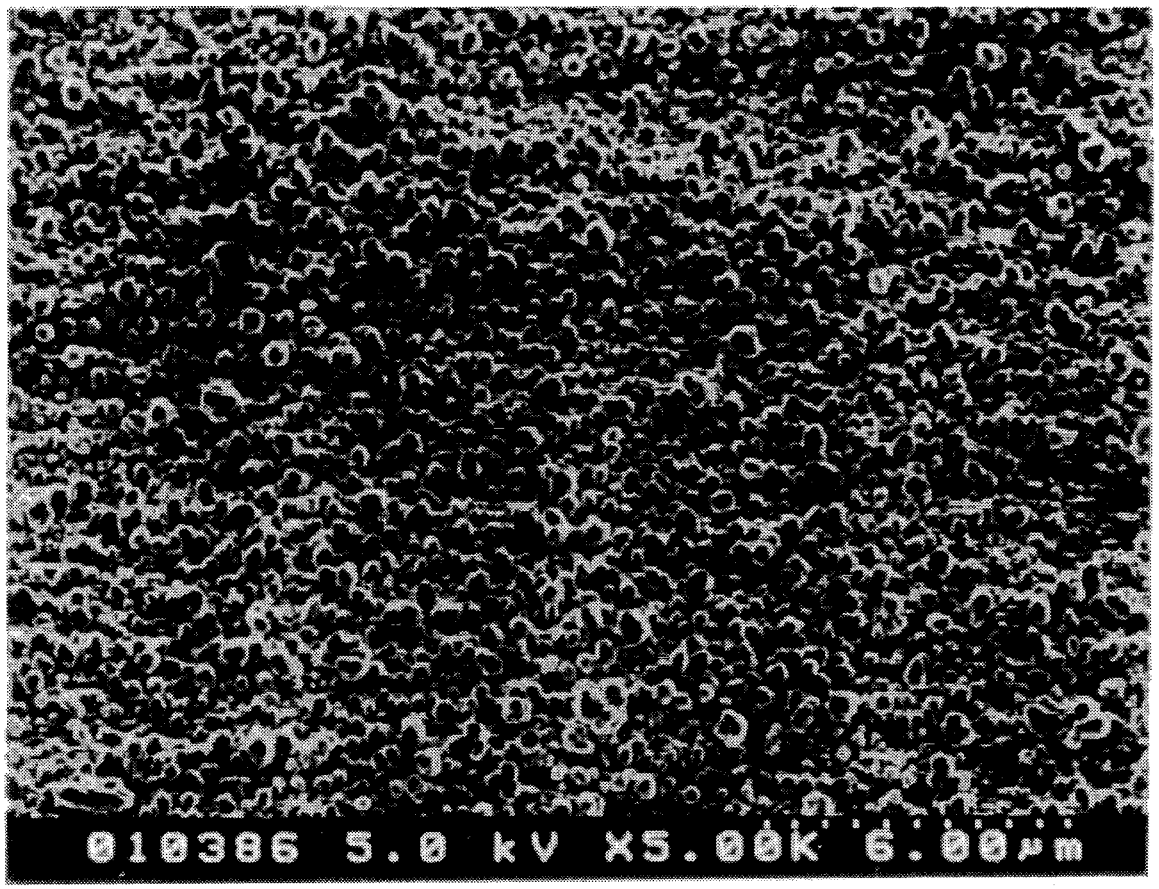

Next, Examples of the present invention will be explained in detail.

EXAMPLE 1

An electrolytic copper foil with a thickness of 35 μm, where malt surface roughness Rz was 2.8 μm and shiny surface roughness Rz was 1.4 μm, was provided. The copper foil was immersed in a solution containing copper (10 grams/liter), sulfuric acid (45 grams/liter) and α-naphthoquinoline (50 milligrams/liter) as an additive. Insolvable electrodes were disposed respectively at both the sides of the copper foil, and then electrolysis was performed at a current density of 10 A/dm$^2$ for 10 seconds to form nodules on the copper foil.

Thereafter, the copper foil with the nodules was plated with a solution containing copper (50 grams/liter) and sulfuric acid (100 grams/liter) at a current density of 15 A/dm$^2$ for 10 seconds. FIG. 1 is a photograph showing the nodules so formed on the shiny surface of the copper foil. The nodules were measured for their size from the photograph with the result that they were 0.6–0.9 μm in length and 0.3–0.5 μm in maximum diameter on the mat surface while they were 0.6–0.8 μm in length and 0.4–0.6 μm in maximum diameter. In addition, the copper foil so treated was measured for its mat surface roughness and shiny surface roughness with the result that the former roughness Rz was 3.6 μm and the latter Rz was 2.2 μm.

Thereafter, the above-mentioned copper foil so plated was subjected to rust-preventing treatment with a zinc-tin alloy under the conditions shown in Table 1. Table 1 also shows the amounts of rust-preventing metals deposited, which were found by chemical analysis after the end of rust-preventing treatment.

TABLE 1

| Rust-preventing treatment | Example 3 Zinc | Example 1 Zinc—tin | Example 4 Zinc—nickel |
|---|---|---|---|
| Composition (grams/liter) | | | |
| Zinc sulfate | zinc: 2 | zinc: 2 | zinc: 5 |
| Tin sulfate | | tin: 0.5 | |
| Nickel pyrosulfate | | | nickel: 3 |
| Potassium pyrosulfate | 40 | 50 | 100 |
| Conditions | | | |
| pH | 11 | 10 | 9.5 |
| Temperature (°C.) | Room temperature | Room temperature | Room temperature |
| Current density (A/dm$^2$) | 2.5 | 2.5 | 0.2 |

TABLE 1-continued

| Rust-preventing treatment | Example 3 Zinc | Example 1 Zinc—tin | Example 4 Zinc—nickel |
|---|---|---|---|
| Time (sec) | 10 | 10 | 10 |
| Amount of deposition (mg/m$^2$) | | | |
| Zn | 16 | 16 | 6 |
| Ni, Sn | — | Sn 4 | Ni 4 |

After having been subjected to rust-preventing treatment, the copper foil was heated in an oven at 200° C. for 10 seconds to evaporate the moisture attached to the surface of the foil and diffuse the rust-preventing layer therein thereby to prepare a very thin, fine pitched pattern printed circuit inner-layer copper foil. With the copper foil so prepared, a printed circuit board was produced by the following method and tested for evaluation of its properties or characteristics.

An inner-layer board was prepared by hot pressing together three glass epoxy prepregs each having a thickness of 0.18 mm as a core member and the above-mentioned rust-preventive copper foils positioned respectively alongside the outermost sides of the grouped prepregs with the mat surfaces of the foils respectively facing to the grouped prepregs. An inner-layer circuit with a conductor width of 80 μm and an conductor spacing of 160 μm was formed by etching with a solution of ferric chloride, covered with an 0.18 mm thick epoxy resin-impregnated prepreg and further covered with an 0.35 μm thick electrolytic copper foil previously subjected to ordinary treatment and then again hot pressed thereby to prepare a four-layer board.

The results of said test for evaluation of the circuit board are shown in Table 2. The evaluation test includes the following particular tests.
(1) Inner layer copper foil peeling test
This particular test was conducted according to JIS C 6486.
(2) Voluminal resistivity
This particular test was conducted according to JIS C 6486.
(3) Haloing characteristic test
A drill hole of 4 mmφ was formed in the four-layer board and then the drilled board was immersed in a 12% solution of hydrochloric acid for 30 minutes and then measured for the haloing length of the board.
(4) Hydrochloric-acid resisting test
There were prepared two kinds of ordinary, one side-clad boards each comprising a copper foil and a substrate to which the mat or shiny surface of the copper foil is adhered. The two kinds of boards so prepared were each treated so as to form patterns of 0.2 mm conductor wide on the substrate by etching and then immersed in 1:1 aqueous solution of hydrochloric acid for 30 minutes. Before and after the immersion, peeling tests were made on the boards according to JIS C 6481 for their deterioration rate.

EXAMPLE 2

The rust prevention-treated copper foil obtained in Example 1 was electrolyzed using the copper foil as a cathode and using a stainless steel plate as an anode at 1 A/dm$^2$ for 5 seconds in a solution of chromium oxide at 30° C. and pH value of 4, passed over 5 seconds through a tank where an aqueous solution of 5 g/l of γ-glycidoxypropyl-trimethoxysilane was showered, freed from residual water with rubber rolls and then subjected to heat diffusion treatment at 200° C. for 10 seconds in the same manner as in Example 1.

Preparation of a board and evaluation of the board were carried out in the same manner as in Example 1. The evaluation results are shown in Table 2.

EXAMPLE 3

An electrolytic copper foil with a thickness of 35 μm (where mat surface roughness Rz was 7.0 μm and shiny surface roughness Rz was 0.7 μm) was provided. The mat surface of the copper foil so provided was chemically polished with a chemical polishing solution CPB-80 (trade name, made by Mitsubishi Gas Chemical Co.) to an extent that Rz became 2.8 μm. Thereafter, tile shiny surface of said copper foil was etched with CPB-60 (trade name, made by Mitsubishi Gas Chemical Co.), to roughen it to an extent that Rz became 1.5 μm.

The copper foil so treated was then subjected to nodule formation and plating in the same manner as in Example 1. The nodules formed on said copper foil were photographically measured for their size with the result that the nodules on the mat surface of the copper foil were 0.6–0.9 μm in length and 0.3–0.5 μm in maximum diameter, while those on the shiny surface were 0.6–0.8 μm in length and 0.4–0.6 μm in maximum diameter.

The copper foil having nodules formed thereon was subjected to rust-preventing treatment with zinc under the conditions indicated in Table 1 and subsequently treated and evaluated in the same manner as in Example 1. The results are shown in Table 2.

EXAMPLE 4

An electrolytic copper foil that was the same as that used in Example 3, where mat surface roughness Rz was 7.0 μm and shiny surface roughness Rz was 0.7 μm, was rolled at a working ratio of 10% to obtain a rolled copper foil, where mat surface roughness Rz was 2.0 μm and shiny surface roughness Rz was 1.0 μm.

The rolled copper foil was subjected to nodule formation and plating under the same conditions as those used in Example 1. The nodules so formed on said foil were photographically measured for their sizes with the result that the nodules formed on the mat surface were 0.6–0.8 μm in length and 0.3–0.5 μm in maximum diameter while those on the shiny surface were 0.6–0.8 μm in length and 0.3–0.6 μm in maximum diameter.

This copper foil having nodules thereon was subjected to rust-preventing treatment with a zinc-nickel alloy indicated in Table 1 and then further treated and tested for evaluation. The evaluation results are shown in Table 2.

EXAMPLE 5

A rolled copper foil with a thickness of 35 μm, where both surfaces each had surface roughness Rz of 0.4 μm, was electrolytically degreased and then anodically electrolyzed in a solution acidified with sulfuric acid in such a manner that the current density for one surface was made to differ from that for the other surface thereby to obtain a copper foil having one mat surface with surface roughness Rz of 2.3 μm and the other shiny surface with surface roughness Rz of 1.2 μm. The copper foil so obtained was subjected to nodule formation and plating in the same manner as in Example 1. The nodules so formed were photographically measured for their size with the result that those formed on the mat surface were 0.6–0.9 μm in length and 0.3–0.6 μm in maximum diameter, while those formed on the shiny surface were 0.6–0.8 μm in length and 0.3–0.6 μm in maximum diameter.

The subsequent treatments and the evaluation were carried out in the same manner as in Example 1. The results are as shown in Table 2.

COMPARATIVE EXAMPLE 1

The same electrolytic copper foil (where mat surface roughness Rz was 7.0 μm and shiny surface roughness Rz was 0.7 μm) as used in Example 3, was subjected to nodule formation and plating in the same manner as in Example 1. The nodules so formed were photographically measured for their size with the result that those on the mat surface became big due to concentration of the current on the convex portions and were 1.5–1.8 μm in length and 0.7–1.2 μm in maximum diameter, while those on the shiny surface were unevenly formed because of being low in roughness and were 0.9–1.4 μm in length and 0.6–1.0 μm in maximum diameter. The mat and shiny surfaces at this point were measured for their roughness and found that the former had surface roughness Rz of 8.5 μm and the latter had surface roughness Rz of 1.6 μm.

The subsequent rust-preventing and heat-diffusing treatments were carried out in the same manner as in Example 1.

Using the above copper foil, a print board was prepared in the same manner as in Example, after which the print board was tested for its evaluation with the results being as shown in Table 2.

COMPARATIVE EXAMPLE 2

The same rolled copper foil (where both surfaces had surface roughness Rz of 0.4 μm) as used in Example 5 was prepared.

This copper foil was then subjected to nodule formation and plating in the same manner as in Example 1, after which the nodules formed were photographically measured for their size with the result that those formed on both the surfaces were 0.4–0.7 μm in length and 0.1–0.4 μm in maximum diameter.

At this point, the rolled copper foil was measured for its surface roughness with the result that both the surfaces of the foil each had surface roughness Rz of 1.2 μm.

The above copper foil was subsequently subjected to rust-preventing and heat-diffusing treatments in the same manner as in Example 1. Using the copper foil so treated, a print board was prepared, after which the board was tested for evaluation with the results being shown in Table 2.

COMPARATIVE EXAMPLE 3

The same electrolytic copper foil (mat surface roughness Rz=2.8 μm, shiny surface roughness Rz=1.4 μm) as used in Example 1 was subjected to electrolyrical formation of nodules under ordinary conditions. The electrolyrical conditions were the same as those used in Example 1 except that Example 1 contained the additive, and the plating conditions were the same as those used in Example 1.

The nodules so formed were photographically measured for their size with the result that the density of nodules formed was remarkably low, the nodules on the mat surface were 0.2–0.6 μm in length and 0.1–0.3 mm in maximum diameter and the nodules on the shiny surface were 0.2–0.6 mm in length and 0.1–0.3 μm in maximum diameter. The copper foil with the nodules thereon was measured for its surface roughness with the result that the mat surface had Rz=3.3 μm and the shiny surface had Rz=1.9 μm.

The subsequent rust-preventing and heat-drying treatments, print board preparation and evaluation test were effected under quite the same conditions as used in Example 1, with the results being indicated in Table 2.

COMPARATIVE EXAMPLE 4

With the same electrolytic copper foil (where mat surface roughness Rz was 2.8 μm and shiny surface roughness Rz was 1.4 μm) as used in Example 1, an inner-layer board was produced. The board so produced was so treated as to form a circuit thereon as in Example 1 and then subjected to black oxide treatment with a commercially available black oxide treating agent (PROBOND 80 (trade name) made by SHIPLAY Company), after which the board so treated and outer layers were pressed together in the same manner as in Example 1 thereby to produce a four-layer board which was then tested for evaluation in the same manner as Example 1. The evaluation results are shown in Table 2.

When the thickness of an intermediate prepreg is decreased, insulation resistance can be easily ensured due to low roughness of the bonded copper foil. In addition, since the nodules formed are made of metallic copper, they can be expected to exhibit much higher Haloing-resisting characteristics than copper oxide in the black oxide treatment.

Thus, the present invention makes it possible to simplify a process for producing very thin multilayer boards which will hereafter be prevalent as printed boards, by omitting the black oxide treatment, and simultaneously enhance the quality of such printed boards.

What is claimed is:

1. A printed circuit inner-layer copper foil having inverted tear drop-shaped fine nodules formed on both surfaces thereof each having surface roughness Rz=1 to 8 μm, the nodules having a length of 0.6 to 1.0 μm and a maximum diameter of 0.2 to 0.8 μm.

TABLE 2

| Example/ Comparative Example | Rust-prevention treatment | Peeling strength (kgf/cm) | | Deterioration ratio of hydrochloric acid resisting test (%) | | Voluminal resistivity (Ω · cm) | Haloing (μm) |
| --- | --- | --- | --- | --- | --- | --- | --- |
| | | mat surface (adhered to substrate) | shiny surface (adhered to substrate) | mat surface (adhered to substrate) | shiny surface (adhered to substrate) | | |
| Example 1 | Zinc—tin | 1.80 | 1.35 | 10.5 | 11.3 | 2.3E15 | 0 |
| Example 2 | Zinc—tin Cr: 9 mg/m² | 1.80 | 1.40 | 8.0 | 10.2 | 2.3E15 | 0 |
| Example 3 | Zinc | 1.75 | 1.25 | 11.0 | 12.8 | 2.3E15 | 0 |
| Example 4 | Zinc—Ni | 1.85 | 1.37 | 7.5 | 10.7 | 2.3E15 | 0 |
| Example 5 | Zinc—tin | 1.82 | 1.29 | 10.5 | 12.8 | 2.3E15 | 0 |
| Comp. Ex. 1 | Zinc—tin | 2.12 | 0.75 | 9.4 | 20.8 | 9.1E13 | 0 |
| Comp. Ex. 2 | Zinc—tin | 1.21 | 0.70 | 15.7 | 18.3 | 2.1E15 | 5 |
| Comp. Ex. 3 | Zinc—tin | 1.50 | 1.05 | 18.5 | 23.9 | 8.9E15 | 5 |
| Comp. Ex. 4 | Zinc | 1.50 | 1.20 | 13.2 | 37.4 | 5.9E15 | 105 |

*Comp. Ex.: Comparative Example (Effect of the Invention)

The very thin, fine pitched pottern printed circuit board inner-layer copper foil of the present invention which is obtained by providing both the surfaces of a copper foil with suitable surface roughness and forming fine and uniform nodules on the surfaces of the copper foil by electrodeposition, makes it possible to enhance good adhesion of an inner-layer circuit to a prepreg and improve the circuit-formed board in resistance to hydrochloric acid.

These characteristics or advantages of the copper foil of the present invention can be further increased in effectiveness by subjecting a copper foil having such nodules and surface roughness to treatment with a chromate and/or treatment with a silane coupling agent.

2. A process for producing a printed circuit inner-layer copper foil, comprising the step of electrolytically forming inverted tear drop-shaped fine nodules each having a length of 0.6 to 1.0 μm and a maximum diameter of 0.2 to 0.8 μm on both surfaces of a copper foil each having surface roughness Rz=1 to 3 μm.

3. A printed circuit multi-layer board having a printed circuit inner-layer copper foil having inverted tear drop-shaped fine nodules with a length of 0.6 to 1.0 μm and a maximum diameter of 0.2 to 0.8 μm formed on both surfaces of a copper foil each having surface roughness Rz=1 to 3 μm.

* * * * *

UNITED STATES PATENT AND TRADEMARK OFFICE
CERTIFICATE OF CORRECTION

PATENT NO. : 5,482,784

DATED : JANUARY 9, 1996

INVENTOR(S) : MUNEHARU OHARA, ET AL

It is certified that error appears in the above-identified patent and that said Letters Patent is hereby corrected as shown below:

Column 10,

Claim 1, line 3, after roughness, delete "Rz=1 to 8 μm and substitute therefor -- Rz=1 to 3 μm.

Signed and Sealed this

Eighteenth Day of June, 1996

*Attest:*

BRUCE LEHMAN

*Attesting Officer*     *Commissioner of Patents and Trademarks*